United States Patent
Hwang

(10) Patent No.: US 6,872,236 B1
(45) Date of Patent: Mar. 29, 2005

(54) PREPARATION OF MAGNETIC METAL-FILLED CARBON NANOCAPSULES

(75) Inventor: Gan-Lin Hwang, Tainan (TW)

(73) Assignee: Industrial Technology Research Institute, Hsinchu (TW)

( * ) Notice: Subject to any disclaimer, the term of this patent is extended or adjusted under 35 U.S.C. 154(b) by 78 days.

(21) Appl. No.: 10/329,333

(22) Filed: Dec. 27, 2002

(30) Foreign Application Priority Data

Aug. 2, 2002 (TW) ........................... 91117435 A

(51) Int. Cl.[7] ................................................. B22F 9/14
(52) U.S. Cl. ..................... 75/347; 205/478; 205/555; 423/445 R
(58) Field of Search ................ 75/345, 346, 347, 75/10, 23; 205/478, 555; 423/445 B

(56) References Cited

U.S. PATENT DOCUMENTS

| | | | | |
|---|---|---|---|---|
| 5,456,986 A | * | 10/1995 | Majetich et al. | 428/403 |
| 5,472,749 A | * | 12/1995 | Dravid et al. | 427/580 |
| 5,783,263 A | * | 7/1998 | Majetich et al. | 427/580 |
| 5,965,267 A | * | 10/1999 | Nolan et al. | 428/408 |
| 6,455,021 B1 | * | 9/2002 | Saito | 423/447.3 |
| 2003/0188963 A1 | * | 10/2003 | Takikawa et al. | 204/164 |

* cited by examiner

Primary Examiner—George Wyszomierski
(74) Attorney, Agent, or Firm—Sughrue Mion, PLLC

(57) ABSTRACT

A method of producing magnetic metal-filled carbon nanocapsules. An arc chamber comprising a graphitic anode and a composite graphitic cathode containing at least one kind of magnetic metal or it's derivatives is provided, before introducing an inert gas into the arc chamber, applying a voltage across the cathode and the anode by a pulse current, the voltage sufficient, to generate a carbon arc reaction between the cathode and the anode, and finally collecting a deposit formed on the cathode.

30 Claims, 3 Drawing Sheets

PREPARATION OF MAGNETIC METAL-FILLED CARBON NANOCAPSULES

FIELD OF THE INVENTION

The present invention relates to a method for producing magnetic metal-filled carbon nanocapsules, and more particularly to a method for producing high purity magnetic metal-filled carbon nanocapsules.

BACKGROUND OF THE INVENTION

A magnetic metal-filled carbon nanocapsule is a polyhedral carbon cluster constituting multiple graphite layers having a balls-within-a ball structure with magnetic metals, metal compounds, metal, carbides or alloys therein. The diameter of a magnetic metal-filled carbon nanocapsule is about 3–100 nm. Magnetic metal-filled, carbon nanocapsules have special fullerene structure and optoelectronic properties. The magnetic metal nanoparticles therein is well-protected by the outer graphite layers from oxidation and acidic etching. Magnetic metal-filled carbon nanocapsules can be utilized in various fields such as medicine (medical grade active carbon), light and heat absorption, magnetic recording, magnetic fluids, catalysts, sensors, and nanoscale composite materials with thermal conductivity, special magnetic and electrical properties.

However, conventional methods for producing magnetic metal-filled carbon nanocapsules produce mainly single layer carbon nanotubes, but few carbon nanocapsules. Owing to the strong van der Waals force between carbon nanocapsules and nanotubes, it is not easy to separate the products. In addition, single layer carbon nanotubes have an end capped with metal particles of catalyst having magnetism as the magnetic metal-filled carbon nanocapsules, therefore magnetic attraction cannot be used for product separation. Conventional methods are not able to produce high purity magnetic metal-filled carbon nanocapsules, huge amounts of carbon ash impurities and single layer carbon nanotubes exist and lower the purity of products, increasing the cost. The related application on magnetic metal-filled carbon nanocapsules is limited and insufficient.

SUMMARY OF THE INVENTION

The object of the present invention is to provide a method for producing high purity magnetic metal-filled carbon nanocapsules.

To achieve the above-mentioned object, the inventive method for producing high purity magnetic metal-filled carbon nanocapsules includes the following steps. An arc chamber comprising a graphitic anode and a composite graphitic cathode containing at least one kind of magnetic metal or its derivatives is provided; an inert gas is introduced into the arc chamber. A voltage is applied across the cathode and the anode by a pulse current, the voltage sufficient to generate an carbon arc reaction between the cathode and the anode. Finally, the deposit formed on the cathode is collected. Moreover, after the collection step, the method of the present invention can further include the following purification steps. The deposit is dispersed in a solution using a surfactant. Next, the magnetic metal-filled carbon nanocapsule main product and the carbon nanotube byproduct are separated using column chromatography or filter film. Finally, the magnetic metal-filled carbon nanocapsules are extracted by magnetic attraction and cleaned by acidic or basic solution and alcohol.

BRIEF DESCRIPTION OF THE DRAWINGS

The present invention will become more fully understood from the detailed description given hereinbelow and the accompanying drawings, given by way of illustration only and thus not intended to be limitative of the present invention.

DETAILED DESCRIPTION OF THE INVENTION

The present invention uses pulse current under high pressure (above 1 atm) of an inert gas to undergo a carbon arc reaction. During the carbon arc reaction, the temperature at the electrode surface and the density of the carbon vapor are changed. Thus, the magnetic metal-filled carbon nanocapsules obtained will have an improved yield.

Figure 1:
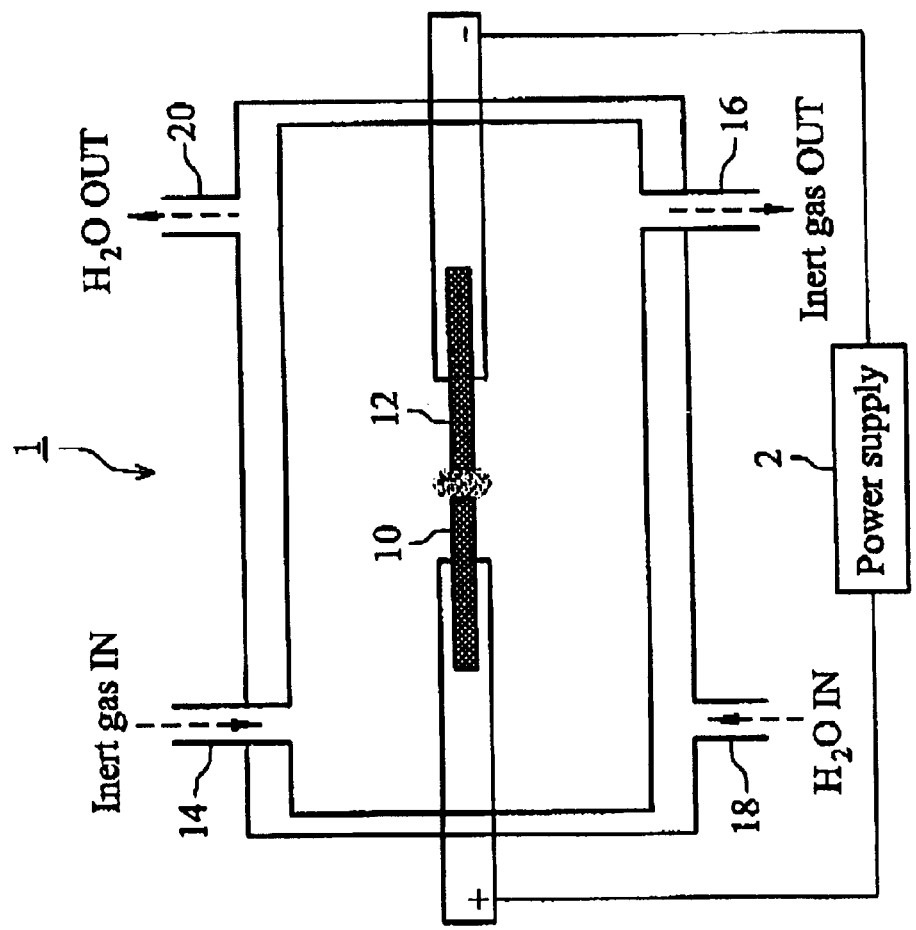
FIG. 1 shows a schematic diagram of an arc chamber according to the present invention.

FIG. 1 shows a schematic diagram of an arc chamber according to the present invention. Referring to FIG. 1, the arc chamber 1 includes at least one pair of electrodes 10 and 12 for carbon arc reaction. Inert gas is introduced into the arc chamber 1 via an inlet 14 and is expelled via an outlet 16. The arc chamber 1 is surrounded by flowing cooling water. Symbol 18 indicates a cooling water inlet, and symbol 20 a cooling water outlet.

In the present invention, the arc reaction is conducted under a flowing inert gas. The flow rate of the inert gas can be controlled to 10 to 200 $mm^3$/min, preferably 30 to 120 $mm^3$/min. Inert gas suitable for use in the present invention includes but is not limited to helium, argon, and nitrogen. The pressure of the arc chamber can be controlled to 0.1 to 5 arm, preferably 1 to 2 atm.

The electrode 10 can be graphite. Generally, the electrode 10 is in the form of a graphite rod. The electrode 12 is a composite graphitic electrode containing at least one kind of magnetic metal or its derivatives. Generally, the electrode 12 is a mixture of carbon powders and powders of at least one kind of magnetic metal or its derivatives. The molar mixing ratio of carbon powders and powders of at least one kind of magnetic metal or its derivatives is 100:1 to 5:1. The composite graphite electrode can further comprise graphitizable resin. The resin is mixed with the powders and pressed, and molded after graphitization via annealing without oxygen under high temperature between 400 to 1500° C. The weight ratio of resin to powders is between 1:10 and 3:10. The resin can be melamine resin, epoxy resin, phenolic resin or other graphitizable resins. The magnetic metal can be Sc, V, Cr, Fe, Co, Ni, Y, Zr, Mo, Ru, Pd, La, Ce, Pr, Nd, Gd, Tb, Dy, Ho, Er, Tm, Lu, Ta, Os, Ir, Pt, Au, Th, U or a combination thereof, preferably Co, Fe, Ni, La, Y or a combination thereof. The derivatives of magnetic metals can be alloy of the magnetic metal and another element, oxide and/or carbide of the magnetic metal.

In the process of producing magnetic metal-filled carbon nanocapsules, electrical energy is applied from a power supply 2 to the graphitic anode 10 and composite graphitic cathod 12. The electric energy applied has a voltage sufficient to generate a carbon arc reaction between the anode 10 and the cathode 12 and to form deposit on the graphitic anode 10.

According to the main feature of the present invention, when performing the carbon arc reaction, a pulse current with a predetermined frequency applies a voltage across the cathode and anode. However, in the conventional techiques, DC (direct current) or AC (alternating current), rather than pulse current, is used to apply voltage. According to the present invention, the pulse current can have a frequency of 0.01 to 1000 Hz, and can be controlled to 50 to 800 A, and the voltage between electrodes can be controlled to 10 to 30 V.

After the carbon arc reaction is conducted according to the above conditions, a deposit is formed on the anode 10. According to the present invention, most of the obtained magnetic metal-filled carbon nanocapsules are present in the core portion of the deposit. Therefore, preferably, the core portion of the deposite on the anode 10 is collected. The core portion of the deposite is black powder and is referred to as "crude product" in the following descriptions. The crude product includes magnetic metal-filled carbon nanocapsules main product (40% to 90%), hollow carbon nanocapsules and short carbon nanotube byproduct (10% to 50%), and few (under 10) metal particles not surrounded by carbon layers. After further purification of the crude product, high purity magnetic metal-filled carbon nanocapsules are obtained. The purification process is described below. First, the crude product is dispersed in a solution using a surfactant. Then, the magnetic metal-filled carbon nanocapsules main product and the hollow carbon nanocapsules are separated from the short carbon nanotube byproduct in the solution using column chromatography or a filter film. Furthermore, the magnetic metal-filled carbon nanocapsules are extracted by magnetic attraction. Finally, the surfactant and the residue metal particles are washed away from the magnetic metal-filled carbon nanocapsules using acidic or basic solution and alcohol. Magnetic metal-filled carbon nanocapsules having a purity higher than 80%, generally 95%, are obtained.

Surfactant suitable for use in the present invention can be a cation surfactant such as cetyltrimethyl ammonium bromide, an anion surfactant such as sodium dedecyl sulfate, a zwitterion surfactant such as alkyl betaine, or a non-ionic surfactant such as lauryl alcohol ether. Preferable examples are certyltrimethyl ammonium bromide and sodium dedecyl sulfate. For column chromatography, the suitable column can have size exclusion function. For example, the column can preferably have a filter film at the front, and the pore size of the filter film can be about 0.2 $\mu$m. In addition, rather than using column chromatography, a filter film can be singly used to perform separation. When a filter film is used for separation, several filterings can be performed to achieve better separation.

Compared with conventional techniques, the present invention is the only currently available way to obtain high purity magnetic metal-filled carbon nanocapsules.

The following example is intended to illustrate the process and the advantages of the present invention more fully without limiting its scope, since numerous modifications and variations will be apparent to those skilled in the art.

EXAMPLE

This example uses the arc chamber shown in FIG. 1 to prepare magnetic metal-filled carbon nanocapsules. One graphite rod was used as a anode, and one composite graphite rod was used as a cathode. Both electrodes had a diameter of 0.24 inches and the anode had a rather short length of about 8–10 cm. The composite graphite electrode was made by mixing the powders of carbon and Co at a molar ratio of 100:5 with melamine resin having a weight percent of 20 of total powders weight. The mixture was then molded into an electrode by a hot-press machine under 170° C. The composite electrode was heated to 700° C. without exposure to oxygen to graphitize the resin.

Argon was introduced into the arc chamber at 60–90 $cm^3$/min. The pressure of the arc chamber was controlled to 1.2 atm. The arc chamber was surrounded by flowing cooling water.

A carbon arc reaction was performed under the following conditions: a pulse frequency of about 60 Hz, voltage of about 20 V, and electric current of about 100 A. The carbon arc reaction proceeded for about 30 minutes and then stopped. A deposit was formed on the anode. The deposit was about 34 cm long and had the same diameter as the graphitic anode. The deposit was cut and a black powdery crude product was obtained in the core portion of the deposit. The crude product contained about 70% Co-filled carbon nanocapsules, 30% hollow nanocapsules and short carbon nanotubes, and a trace of Co particles not surrounded by carbon layers.

Figure 2:
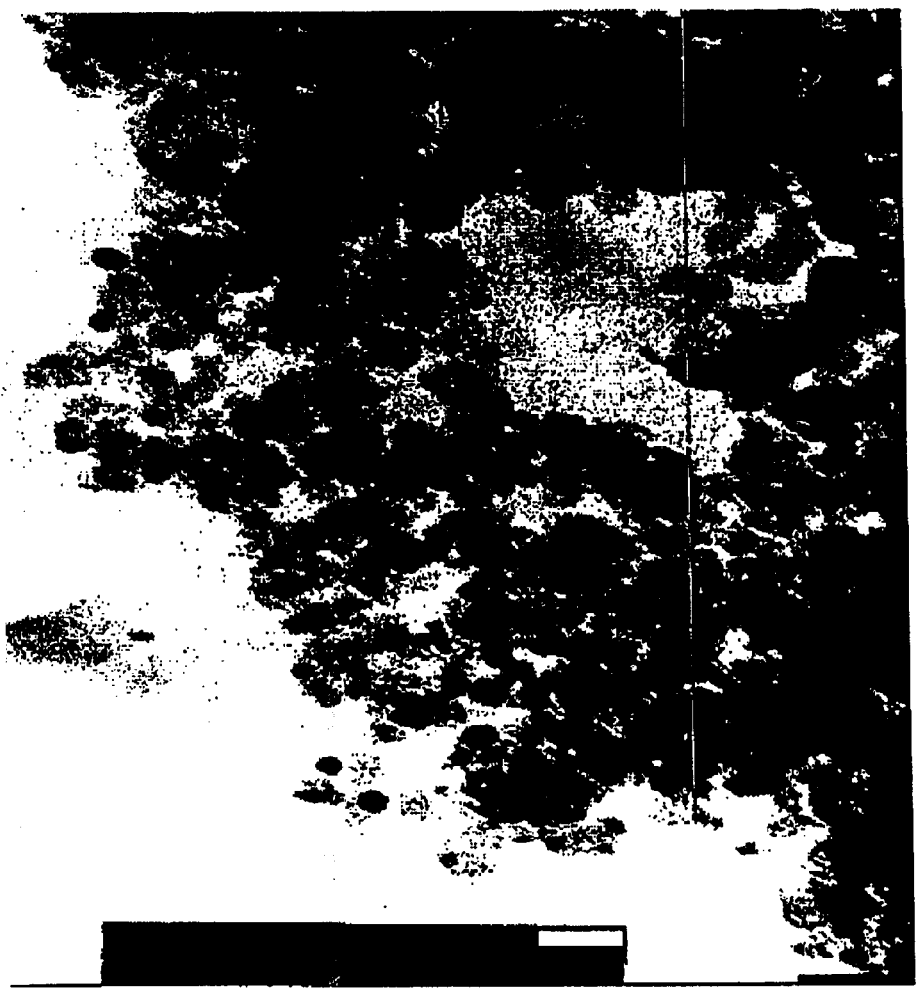
FIG. 2 is a TEM photograph of the purified magnetic metal-filled carbon nanocapsules of the present invention.
Figure 3:
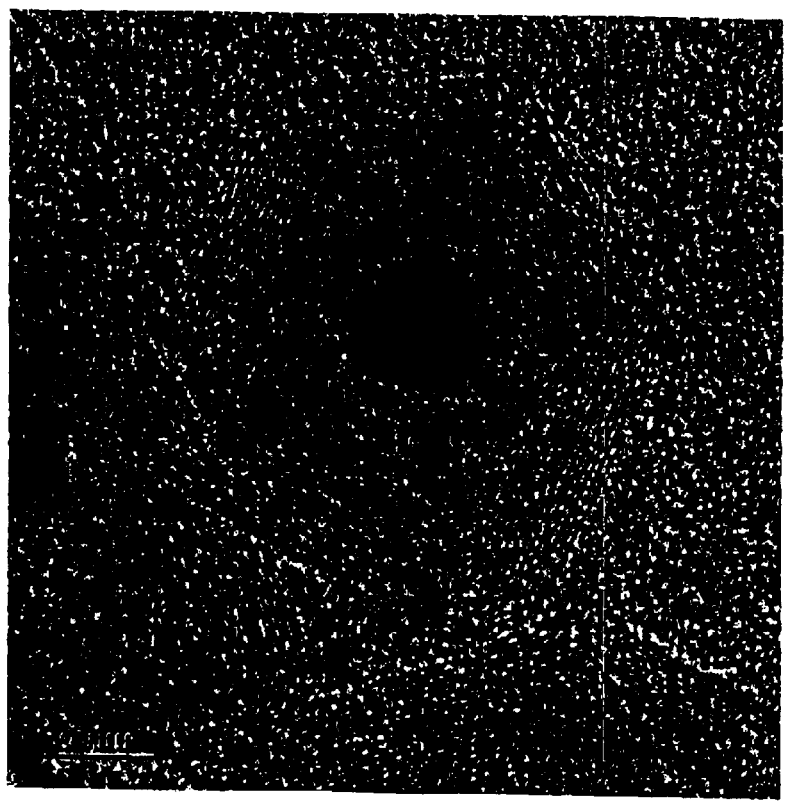
FIG. 3 is a high resolution TEM photograph of the purified magnetic metal-filled carbon nanocapsules of the present invention.

The crude product was dispersed in a solution using a surfactant. Then, the dispersion solution was subjected to column chromatography to separate the Co-filled carbon nanocapsules and carbon nanotubes. Finally, the Co-filled carbon nanocapsules were extracted by magnetic attraction, and the surfactant and residue Co particles were washed away from the Co-filled carbon nanocapsules by acidic or basic solution and alcohol. The Co-filled carbon nanocapsules obtained had higher than 95% purity. FIG. 2 is a TEM (transmission electron microscopy) photograph of the purified Co-filled nanocapsule product. FIG. 3 is a high resolution TEM photograph of the purified Co-filled carbon nanocapsules.

The foregoing description of the preferred embodiments of this invention has been presented for purposes of illustration and description. Obvious modifications or variations are possible in light of the above teaching. The embodiments chosen and described provide an excellent illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A method of producing magnetic metal-filled carbon nanocapsules, comprising:

providing an arc chamber comprising a graphitic anode and a composite graphitic cathode containing at least one kind of magnetic metal or its derivatives, wherein the derivatives are alloys of the magnetic metal and another element, oxide and/or carbide of the magnetic metal, and introducing an inert gas into the arc chamber, wherein the arc chamber has a pressure of 1–2 atm;

applying a voltage across the cathode and the anode by a pulse current, the voltage being sufficient to generate a carbon arc reaction between the cathode and the anode; and collecting a deposit comprising the nanocapsules formed on the cathode.

2. The method as claimed in claim 1, wherein the graphitic anode is in the form of a graphite rod.

3. The method as claimed in claim 1, wherein the composite graphitic cathode is formed from a mixture of carbon powders and powders of at least one kind of magnetic metal or its derivatives.

4. The method as claimed in claim 3, wherein the mixture further comprises a graphitizable resin.

5. The method as claimed in claim 4, wherein the graphitizable resin is melamine resin, epoxy resin or phenolic resin.

6. The method as claimed in claim 4, wherein the weight ratio of graphitizable resin to carbon powders and powders of at least one kind of magnetic metal or its derivatives is between 1:10 to 3:10.

7. The method as claimed in claim 3, wherein the molar mixing ratio of carbon powders and powders of at least one kind of magnetic metal or its derivatives is between 100:1 and 5:1.

8. The method as claimed in claim 1, wherein the magnetic metal is Sc, V, Cr, Fe, Co, Ni, Y, Zr, Mo, Ru, Pd, La, Ce, Pr, Nd, Gd, Th, Dy, Ho, Er, Tm, Lu, Ta, Os, Ir, Pt, Au, Th, U or a combination thereof.

9. The method as claimed in claim 1, wherein the inert gas has a flow rate of 10 to 200 $mm^3$/min.

10. The method as claimed in claim 1, wherein the pulse current has a frequency of 0.01 to 1000 Hz.

11. The method as claimed in claim 1, wherein the arc reaction is conducted at a pulse frequency of 0.001 to 1000 Hz, at a voltage of 10 to 30 V, and at a current of 50 to 800 A.

12. The method as claimed in claim 1, wherein collection of the deposit further comprises collecting a core portion of the deposit formed on the cathode.

13. The method as claimed in claim 12, wherein the deposit includes a magnetic metal-filled carbon nanocapsule main product, a hollow carbon nanocapsule and carbon nanotube byproducts.

14. A method of producing magnetic metal-filled carbon nanocapsules, comprising:
    providing an arc chamber comprising a graphitic anode and a composite graphitic cathode comprising a mixture of carbon powders, powders of at least one kind of magnetic metal or its derivatives, and a graphitizable resin, wherein the derivatives are alloys of the magnetic metal and another element, oxide and/or carbide of the magnetic metal, and introducing an inert gas into the arc chamber;
    applying a voltage across the cathode and the anode by a pulse current, the voltage sufficient to generate an carbon arc reaction between the cathode and the anode;
    collecting a deposit formed on the cathode, the deposit comprising a magnetic metal-filled carbon nanocapsule main product, a hollow carbon nanocapsule and carbon nanotube byproducts; and
    separating and purifying the deposit to obtain the magnetic metal-filled carbon nanocapsules.

15. The method as claimed in claim 14, wherein the magnetic metal is Sc, V, Cr, Fe, Co, Ni, Y, Zr, Mo, Ru, Pd, La, Ce, Pr, Nd, Gd, Th, Dy, Ho, Er, Tm, Lu, Ta, Os, Ir, Pt, Au, Th, U or a combination thereof.

16. The method as claimed in claim 14, wherein the molar mixing ratio of carbon powders and powders of at least one kind of magnetic metal or its derivatives is between 100:1 and 5:1.

17. The method as claimed in claim 14, wherein the graphitizable resin is melamine resin, epoxy resin or phenolic resin.

18. The method as claimed in claim 14, wherein the weight ratio of graphitizable resin to carbon powders and powders of at least one kind of magnetic metal or its derivatives is between 1:10 to 3:10.

19. The method as claimed in claim 14, wherein the inert gas has flow rate of 10 to 200 $mm^3$/min.

20. The method as claimed in claim 14, wherein the arc chamber has a pressure of 0.1 to 5 atm.

21. The method as claimed in claim 14, wherein the pulse current has a frequency of 0.01 to 1000 Hz.

22. The method as claimed in claim 14, wherein the arc reaction is conducted at a pulse frequency of 0.01 to 1000 Hz, at a voltage of 10 to 30 V, and at a current of 50 to 800 A.

23. The method as claimed in claim 14, wherein collection further comprises collecting a core portion of the deposit formed on the cathode.

24. The method as claimed in claim 14, wherein separation and purification further comprise:
    dispersing the deposit in a solution using a surfactant;
    separating the magnetic metal-filled carbon nanocapsules main product and the carbon nanotube byproduct using column chromatography; and
    extracting the magnetic metal-filled carbon nanocapsules by magnetic attraction and cleaning the magnetic metal-filled carbon nanocapsules by acidic or basic solution and alcohol.

25. The method as claimed in claim 24, wherein the surfactant is a cation surfactant, anion surfactant, zwitterion surfactant, or non-ionic surfactant.

26. The method as claimed in claim 24, wherein the surfactant is cetyltrimethyl ammonium bromide or sodium dodecyl sulfate.

27. The method as claimed in claim 24, wherein separation of the magnetic metal-filled carbon nanocapsules main product and the carbon nanotube byproduct uses a column having a filter film at the front.

28. The method as claimed in claim 27, wherein the filter film has a pore size of about 0.2 µm.

29. The method as claimed in claim 24, wherein the magnetic metal-filled carbon nanocapsules obtained by extraction have a purity between 80% to 99.9%.

30. The method as claimed in claim 24, wherein the magnetic metal-filled carbon nanocapsules obtained by extraction have a purity higher than 95%.

* * * * *